(12) United States Patent
Song

(10) Patent No.: US 10,585,141 B2
(45) Date of Patent: Mar. 10, 2020

(54) PIN CONNECTION TESTING SYSTEM FOR CONNECTOR, AND METHOD THEREOF

(71) Applicants: Inventec (Pudong) Technology Corporation, Shanghai (CN); Inventec Corporation, Taipei (TW)

(72) Inventor: Ping Song, Shanghai (CN)

(73) Assignees: Inventec (Pudong) Technology Corporation, Shanghai (CN); Inventec Corporation, Taipei (TW)

( * ) Notice: Subject to any disclaimer, the term of this patent is extended or adjusted under 35 U.S.C. 154(b) by 76 days.

(21) Appl. No.: 16/009,888

(22) Filed: Jun. 15, 2018

(65) Prior Publication Data

US 2019/0178934 A1 Jun. 13, 2019

(30) Foreign Application Priority Data

Dec. 8, 2017 (CN) .......................... 2017 1 1293008

(51) Int. Cl.
  *G01R 31/28* (2006.01)
  *G01R 31/317* (2006.01)
  *G01R 31/3177* (2006.01)
  *G01R 31/04* (2006.01)
  *G01R 31/3185* (2006.01)

(52) U.S. Cl.
  CPC ....... *G01R 31/3172* (2013.01); *G01R 31/043* (2013.01); *G01R 31/3177* (2013.01); *G01R 31/31721* (2013.01); *G01R 31/31855* (2013.01)

(58) Field of Classification Search
  None
  See application file for complete search history.

(56) References Cited

U.S. PATENT DOCUMENTS

| 7,406,642 | B1* | 7/2008 | Lau | .................. G01R 31/31715 714/727 |
| 9,874,607 | B1* | 1/2018 | Kuit | ...................... H03M 1/109 |
| 2005/0242836 | A1* | 11/2005 | Goetting | ............ G01R 31/3167 326/39 |
| 2005/0242980 | A1* | 11/2005 | Collins | .............. G01R 31/3167 341/155 |

OTHER PUBLICATIONS

R. Schuttert, F. de Jong and B. Kup, "Improved test monitor circuit in power pin DfT," Proceedings 20th IEEE VLSI Test Symposium (VTS 2002), Monterey, CA, USA, 2002, pp. 345-350. (Year: 2002).*

* cited by examiner

*Primary Examiner* — Daniel F. McMahon
(74) *Attorney, Agent, or Firm* — David R. Stevens; Stevens Law Group

(57) ABSTRACT

A pin connection testing system for connector, and a method thereof are disclosed. In the pin connection testing system, a JTAG instruction is used to control a PLD, to drive the demultiplexer to transmit each to-be-tested signal, which is from the connector, to a first line or a second line; and, when the to-be-tested signal is transmitted to the first line, the to-be-tested signal is converted from analog to digital and encoded, and then transmitted to I/O pins of the PLD for reading; and, when the JTAG command is transmitted to the second line, the PLD reads the statuses of the I/O pins electrically connected to the second line; and then the PLD generates a test result according to the to-be-tested signals and the read I/O pins. Therefore, the technical effect of improving convenience in testing the connection status of the connector can be achieved.

10 Claims, 5 Drawing Sheets

PIN CONNECTION TESTING SYSTEM FOR CONNECTOR, AND METHOD THEREOF

CROSS-REFERENCE TO RELATED APPLICATION

This application claims the benefit of Chinese Patent Application No. 201711293008.1, filed Dec. 8, 2017.

BACKGROUND OF THE INVENTION

1. Field of the Invention

The present invention relates to a test system and a method thereof, more particularly to a pin connection testing system which is for a connector and applicable to a boundary scan test environment, and can perform test for the signal other than an I/O interconnection signal, such as a pull-up signal, a pull-down signal, a power signal and a ground signal, and a method thereof.

2. Description of the Related Art

In recent years, with the popularity and rapid development of electronic circuits, how to quickly and correctly test the connection status of connectors has become one of key issues that various manufacturers are eager to solve.

In general, the connection status includes open-circuit (Open) status and short-circuit (Short) status, and the test purpose is to confirm that all pins of the connector are correctly connected, and confirm that no short circuit occurs between the pins, or between the pin and a power source, or between the pin and the ground (GND). In the conventional testing method, probes of a multimeter are to contact two endpoints of the to-be-tested circuit, and a current is then applied. If the two endpoints are conducted to each other, it indicates that a short circuit occurs between the two endpoints; otherwise, an open-circuit status is formed between the two endpoints. However, the conventional method is difficult to test on a complicated circuit, and has the problem of inconvenience in testing connection status of the connector.

In view of this situation, a boundary scan technology is developed, and I/O pins of a programmable logic device (PLD) are electrically connected to the connector, so as to test a connection status of an input/output (I/O) interconnection signal. However, this testing method is unable to test the signal other than the I/O interconnection signal, such as a pull-up signal, a pull-down signal, a power signal, and a ground signal. For this reason, the conventional problem of inconvenience in testing connection status of the connector is not solved effectively.

Therefore, what is needed is to develop an improved technical solution to solve the conventional problem that it is inconvenient to test the connection status of the connector.

SUMMARY OF THE INVENTION

In order to solve the conventional problem, the present invention is to provide a pin connection testing system for connector, and a method thereof.

According to an embodiment, the present invention provides a pin connection testing system for connector. The system is applicable to a boundary scan test environment and comprises a to-be-tested unit and a test unit. The to-be-tested unit comprises a connector which comprise a plurality of connection pins, and each connection pin corresponds to a to-be-tested signal.

The test unit comprises at least one demultiplexer, at least one analog to digital converter (ADC), a microcontroller and a PLD. The at least one demultiplexer is electrically connected to the connector, and configured to selectively transmit each to-be-tested signal, which is from the connector, to a first line or a second line. The at least one ADC comprises a set of analog input pins electrically connected to the first line, and configured to convert the to-be-tested signal which is transmitted to the first line into a digital voltage value. The microcontroller is electrically connected to the at least one ADC, and configured to encode and convert the digital voltage value into N-bit data, wherein N is a positive integer. The PLD comprises a set of I/O pins, and the PLD is electrically connected to the at least one demultiplexer through K pins of the set of I/O pins, to control the at least one demultiplexer to select the first line or the second line, and the PLD is electrically connected to the second line through M pins of the set of I/O pins, to read the status of the to-be-tested signal which is transmitted to the second line, and the PLD is electrically connected to the microcontroller through N pins of the set of I/O pins, to read the N-bit digital voltage value. When one of the to-be-tested signals is the I/O interconnection signal, the PLD performs a boundary scan interconnection test to detect status of the to-be-tested signal which is the I/O interconnection signal and then generates a connection message; when one of the to-be-tested signals is a power signal or a pull-up signal, the PLD controls the at least one demultiplexer to select the first line, and the PLD reads the digital voltage value from the microcontroller, wherein when the read digital voltage value is zero, the PLD generates a first open-circuit message; when one of the to-be-tested signals is a ground signal or a pull-down signal, the PLD controls the at least one demultiplexer to select the second line, and the PLD performs the boundary scan to read a potential status corresponding to the to-be-tested signal which is the ground signal or the pull-down signal, wherein when the potential status is low, the PLD generates a second open-circuit message, wherein K and M are positive integers.

According to an embodiment, the present invention provides a pin connection testing method for connector. The method is applicable to a boundary scan test environment and comprises following steps. First, a to-be-tested unit is provided, and the to-be-tested unit comprises a connector including a plurality of connection pins, and each connection pin corresponds to a to-be-tested signal. Next, a test unit is provided, and the test unit is electrically connected to the to-be-tested unit through the connector, and configured to receive the to-be-tested signals; when one of the to-be-tested signals is an I/O interconnection signal, the test unit performs a boundary scan interconnection test to detect a status of the to-be-tested signal which is the I/O interconnection signal and generates a connection message; when one of the to-be-tested signals is a power signal or a pull-up signal, the test unit transmits the to-be-tested signal which is the power signal or the pull-up signal to the first line, and converts the to-be-tested signal which is the power signal or the pull-up signal into a digital voltage value, wherein when the digital voltage value is zero, the test unit generates a first open-circuit message; and, when one of the to-be-tested signals is a ground signal or a pull-down signal, the test unit transmits the to-be-tested signal which is the ground signal or the pull-down signal to the second line, and performs a boundary scan to read a potential status corresponding to the to-be-tested signal which is the ground signal or the pull-down signal, wherein when the potential status is not low, the test unit generates a second open-circuit message.

According to above content, the difference between the technology of the present invention and the conventional technology is that the system and method of the present invention can use the joint test action group (JTAG) instruction to control the PLD, to drive the at least one demultiplexer to transmit each to-be-tested signal, which is from the connector, to the first line or the second line, and when the to-be-tested signal is transmitted to the first line, the to-be-tested signal is converted from analog to digital and encoded, and then transmitted to the I/O pins of the PLD for reading; and, when the to-be-tested signal is transmitted to the second line, the PLD can read the statuses of the I/O pins electrically connected to the second line; and then the PLD generates a test result according to the to-be-tested signals and the read I/O pins.

The technical means of the present invention can achieve the technical effect of improving convenience in testing the connection statuses of the pins of the connector.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
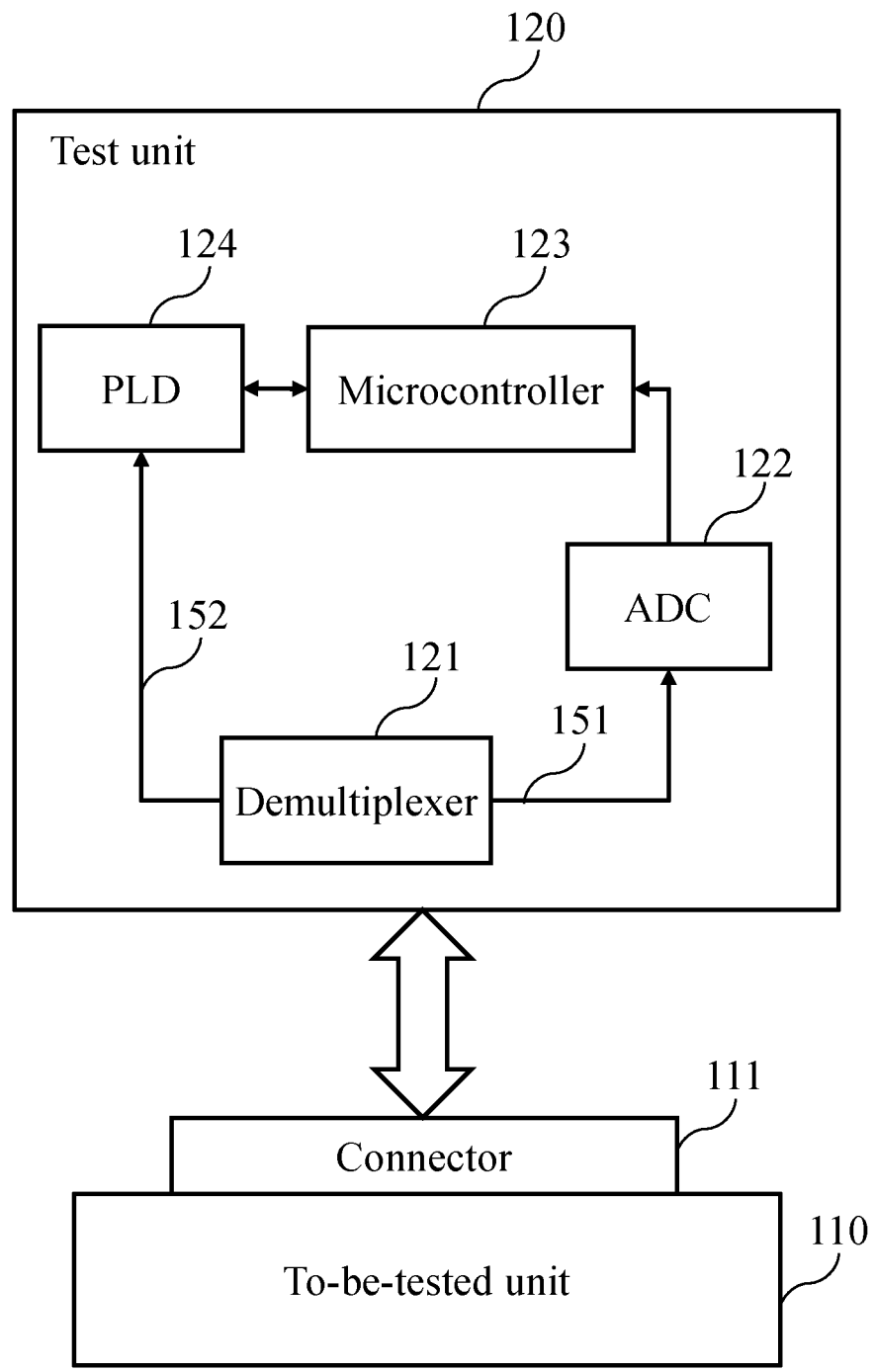
FIG. 1 is a block diagram of a pin connection testing system for connector, according to an embodiment of the present invention.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it is directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

The environment where the system and the method of the present invention is applied is illustrated before description of the pin connection testing system for connector and a method thereof. The system and method are applicable to a boundary scan test environment, and pins of a connector on the to-be-tested unit are tested by using a test unit, to determine whether an error condition occurs, such as an open circuit, a short circuit with a ground line, and a short circuit between the pins. The to-be-tested unit is electrically connected to the test unit through the connector, and a JTAG instruction is used to control the PLD of the test unit to read statuses of the I/O pins of the PLD.

The system and method of the present invention will hereinafter be described in more detail, with reference to the accompanying drawings. Please refer to FIG. 1, which is a block diagram of a pin connection testing system for connector, according to an embodiment of the present invention. The system is applicable to a boundary scan test environment, and comprises a to-be-tested unit 110 and a test unit 120. The to-be-tested unit 110 comprises a connector 111, and the connector 111 comprises a plurality of connection pins, and each connection pin corresponds to a to-be-tested signal. In actual implementation, each to-be-tested signal can be generated by a JTAG device or a central processing unit disposed on the to-be-tested unit 110. Furthermore, the connector 111 can be one of various slots, for example, the connector 11 can be a peripheral component interconnect (PCI) slot, a PCI express (PCIe) slot, a dual in-line memory module (DIMM) slot, or a small outline dual in-line memory module (SODIMM) slot.

The test unit 120 comprises a demultiplexer 121, an ADC 122, a microcontroller 123 and a programmable logic device (PLD) 124. The demultiplexer 121 is electrically connected to the connector 111, and configured to selectively transmit each to-be-tested signal, which is from the connector 111, to a first line 151 or a second line 152. In actual implementation, the demultiplexer 121 can be implemented by an electronic device with model number 74CBTLV3257; however, the application of the present invention is not limited thereto. Furthermore, a channel selection signal line (not shown in figures) is formed between the demultiplexer 121 and the PLD 124, and one end of the channel selection signal line is electrically connected to the I/O pin of the PLD 124 and the other end is electrically connected to a selection pin of the demultiplexer 121; for example, the pin 1 of the electronic device with model number 74CBTLV3257 is the selection pin. The PLD 124 can control the demultiplexer 121, through the channel selection signal line, to transmit each to-be-tested signal to the first line 151 or the second line 152. It is to be noted that the difference between the demultiplexer and the multiplexer (MUX) is the direction of data transmission, the demultiplexer comprises one input terminal and multiple output terminals, and the MUX comprises multiple input terminals and one output terminal.

The ADC 122 comprises a set of analog input pins electrically connected to the first line 151, and configured to convert the to-be-tested signal which is transmitted to the first line into a digital voltage value; in other words, the ADC 122 is configured to convert a continuous and analog signal into a digital and discrete signal.

The microcontroller 123 is electrically connected to the ADC 122, and configured to encode and convert the digital voltage value into N-bit data, and output the N-bit data to the PLD 124, wherein N is a positive integer. In actual implementation, when the digital voltage value is converted into 8-bit data, N is 8, and eight conductive lines are required to form between the microcontroller 123 and the PLD 124 to transmit the 8-bit digital voltage value. Particularly, these eight conductive lines are electrically connected to the I/O pins of the PLD 124.

The PLD 124 comprises a set of I/O pins. Particularly, the PLD 124 is electrically connected to the demultiplexer 121 through K pins of the set of I/O pins, to control the demultiplexer 121 to select the first line 151 or the second line 152; the PLD 124 is electrically connected to the second line 152 through M pins of the set of I/O pins, to read the status of the to-be-tested signal which is transmitted to the second line; and, the PLD 124 is electrically connected to the microcontroller 123 through N pins of the set of I/O pins, to read the N-bit digital voltage value, wherein K and M are positive integers. When one of the to-be-tested signals is an I/O interconnection signal, the PLD 124 performs a boundary scan interconnection test, to detect status of the to-be-tested signal which is the I/O interconnection signal and generates a connection message; for example, the electric potential of the to-be-tested signal which is the I/O interconnection signal can be recorded in the connection message, or the information indicating whether there is a short-circuit or an open-circuit condition can be recorded in the connection message. When one of the to-be-tested signals is a power signal or a pull-up signal, the PLD 124 controls the demultiplexer 121 to select the first line 151, and the PLD 124 reads the digital voltage value from the microcontroller 123, and when the read digital voltage value is zero, the PLD 124 generates a first open-circuit message, for example, the first open-circuit message can be a text message describing that the power signal or the pull-up signal is at open-circuit status. Next, when one of the to-be-tested signal is a ground signal or a pull-down signal, the PLD 124 controls the demultiplexer 121 to select the second line 152, and the PLD 124 performs the boundary scan to read an electric potential corresponding to the to-be-tested signal which is the ground signal or the pull-down signal, and when the read potential status is not low, the PLD 124 generates a second open-circuit message, for example, the second open-circuit message can be a text message describing that the ground signal or the pull-down signal is at the open-circuit status. In actual implementation, when one of the to-be-tested signals is the pull-up signal and the read digital voltage value is not zero, the PLD 124 can switch the selection of demultiplexer 121 from the first line 151 to the second line 152, and the PLD 124 performs the boundary scan interconnection test, to read the status of the to-be-tested signal which is transmitted to the second line through the M pins, so as to detect whether a short circuit occurs between the connection pins of the connector 111. Furthermore, when one of the to-be-tested signals is the pull-down signal and the read potential status is not high, the PLD 124 performs the boundary scan interconnection test, to read the status of the to-be-tested signal which is transmitted to the second line through the M pins, so as to detect whether a short circuit occurs between the connection pins of the connector 111. In particular implementation, the PLD 124 can be a complex programmable logic device (CPLD), a field-programmable gate array (FPGA), and so on.

Figure 2A:
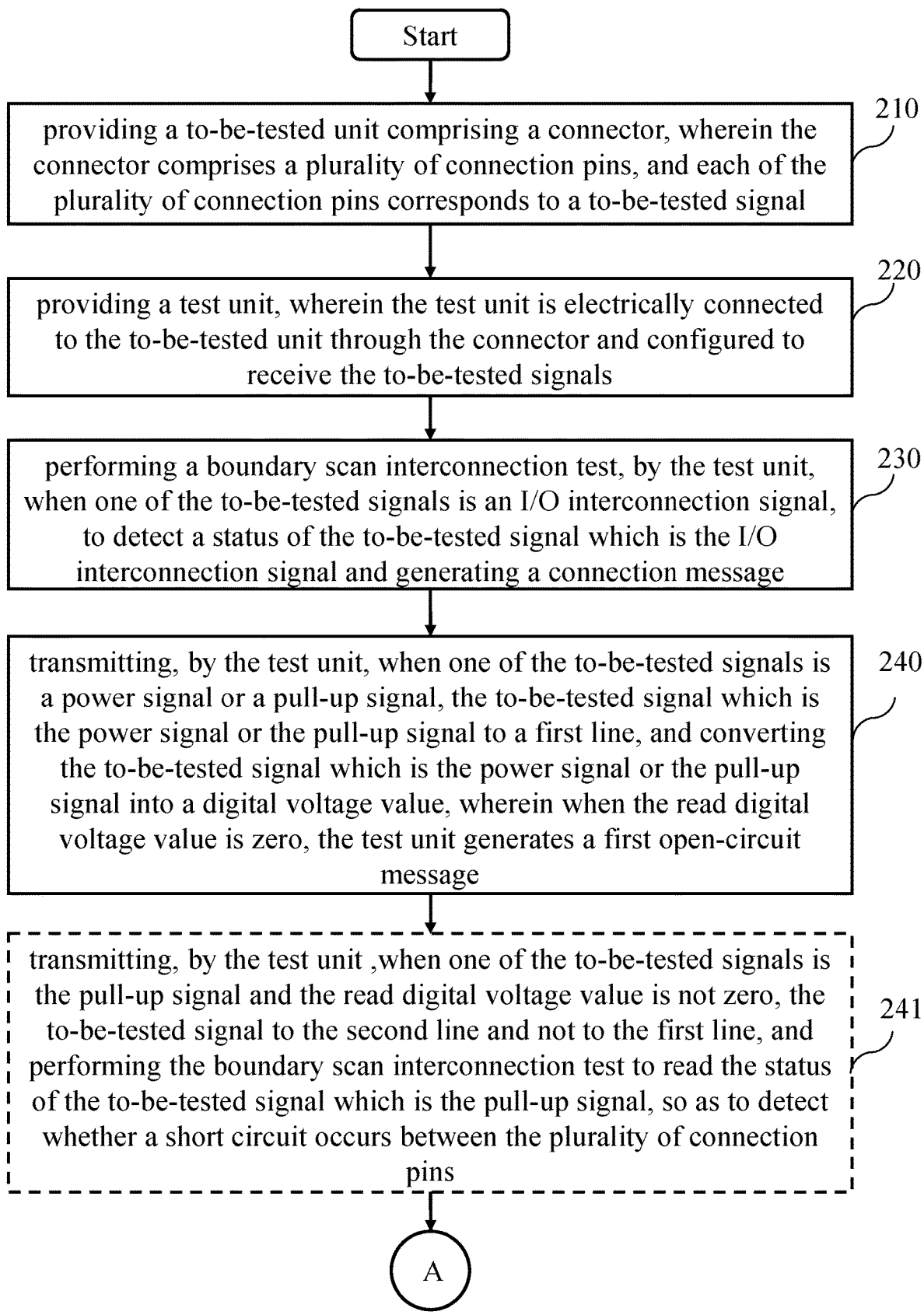
FIGS. 2A and 2B are flow charts of a pin connection testing method for connector, according to an embodiment of the present invention.
Figure 2B:
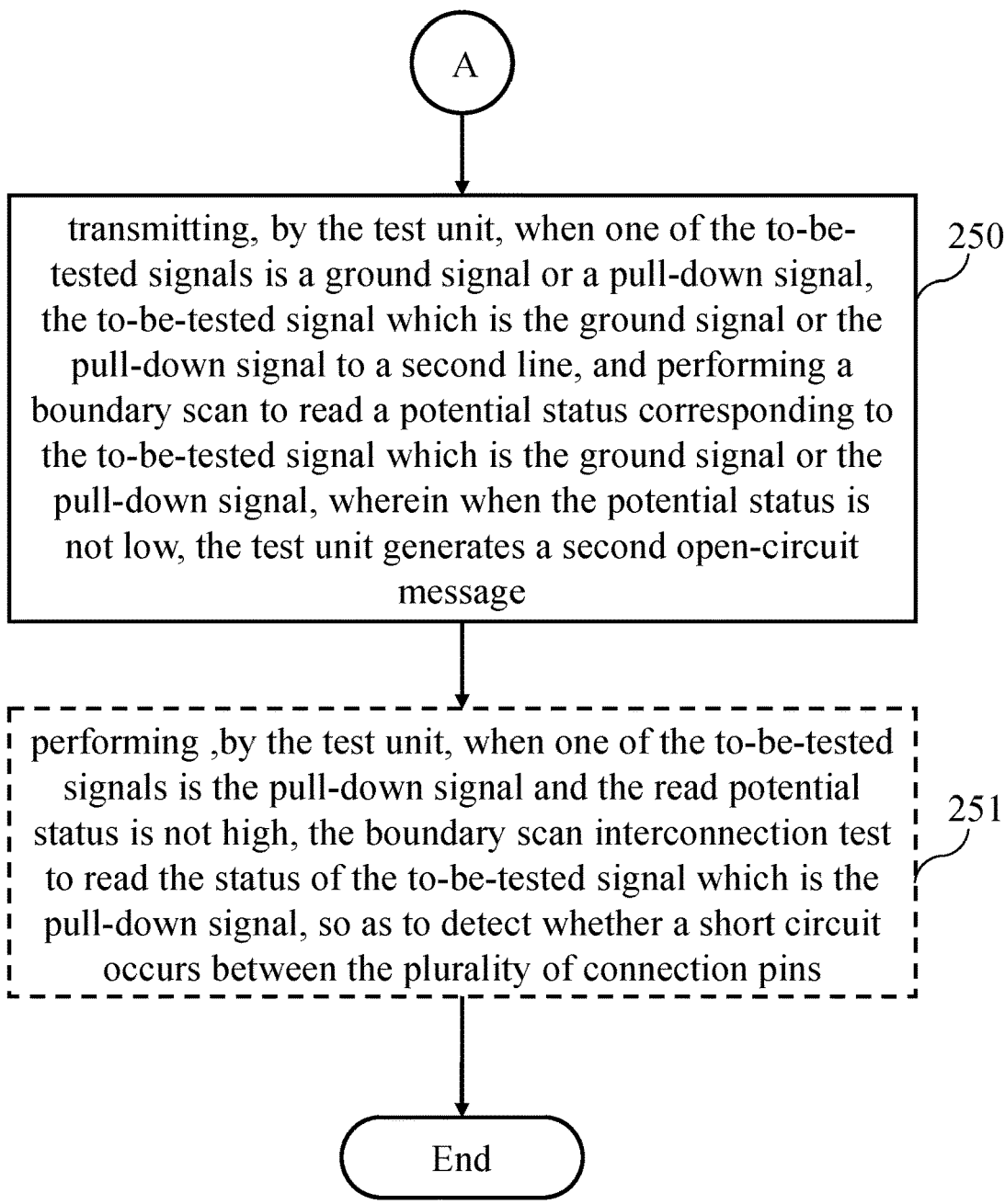

Please refer to FIGS. 2A and 2B, which are flow charts of pin connection testing method for connector, according to an embodiment of the present invention. The method is applicable to a boundary scan test environment and comprises steps 210 to 250. In the step 210, the to-be-tested unit 110 is provided, and the to-be-tested unit 110 comprises the connector 111, and the connector 111 comprises the plurality of connection pins, and each connection pin corresponds to a to-be-tested signal. In the step 220, the test unit 120 is provided, and the test unit 120 is electrically connected to the to-be-tested unit 110 through the connector 111, and configured to receive the to-be-tested signals. In the step 230, when one of the to-be-tested signals is the I/O interconnection signal, the test unit 120 performs the boundary scan interconnection test, to detect the status of the to-be-tested signal which is the I/O interconnection signal and generates the connection message. In the step 240, when one of the to-be-tested signals is the power signal or the pull-up signal, the test unit 120 transmits the to-be-tested signal which is the power signal or the pull-up signal to the first line 151, and the to-be-tested signal which is the power signal or the pull-up signal is converted into the digital voltage value, wherein when digital voltage value is zero, and the test unit 120 generates the first open-circuit message. In the step 250, when one of the to-be-tested signals is the ground signal or the pull-down signal, the test unit 120 transmits the to-be-tested signal which is the ground signal or the pull-down signal to the second line 152, and performs the boundary scan to read the potential status corresponding to the to-be-tested signal which is the ground signal or the pull-down signal, wherein when the potential status is not low, the test unit 120 generates the second open-circuit message. Through aforementioned steps, the system and method of the present invention can use the JTAG instruction to control the PLD 124 to drive the demultiplexer 121 to transmit each to-be-tested signal, which is from the connector 111, to the first line 151 or the second line 152; and when the to-be-tested signal is transmitted to the first line 151, the to-be-tested signal is converted from analog to digital and encoded, and then transmitted to the I/O pins of the PLD 124 for reading; and, when the to-be-tested signal is transmitted to the second line 152, the PLD 124 can read the statuses of the I/O pins electrically connected to the second line 152; and then the PLD generates the test result according to the to-be-tested signals and the read I/O pins.

In an embodiment, a step 241 can be performed after the step 240. In the step 241, when one of the to-be-tested signal is the pull-up signal and the read digital voltage value is not zero, the to-be-tested signal which is the pull-up signal is transmitted to the second line 152, instead of the first line 151, and the boundary scan interconnection test is performed to read the status of the to-be-tested signal, so as to detect whether a short circuit occurs between the connection pins. In an embodiment, a step 251 can be performed after the step 250. In the step 251, when one of the to-be-tested signals is the pull-down signal and the read potential status is not high, the boundary scan interconnection test is performed to read the status of the to-be-tested signal which is the pull-down signal, so as to detect whether a short circuit occurs between the connection pins. It is to be noted that, in actual implementation, the to-be-tested unit 110 and the test unit 120 can comprise a JTAG interface, respectively, configured to receive the JTAG instruction from a terminal machine, so that the terminal machine can control the test unit 120 according to the JTAG instruction, and read the status of the to-be-tested signal transmitted from the second line 152, for example, the status of the to-be-tested signal can be high or low.

Figure 3:
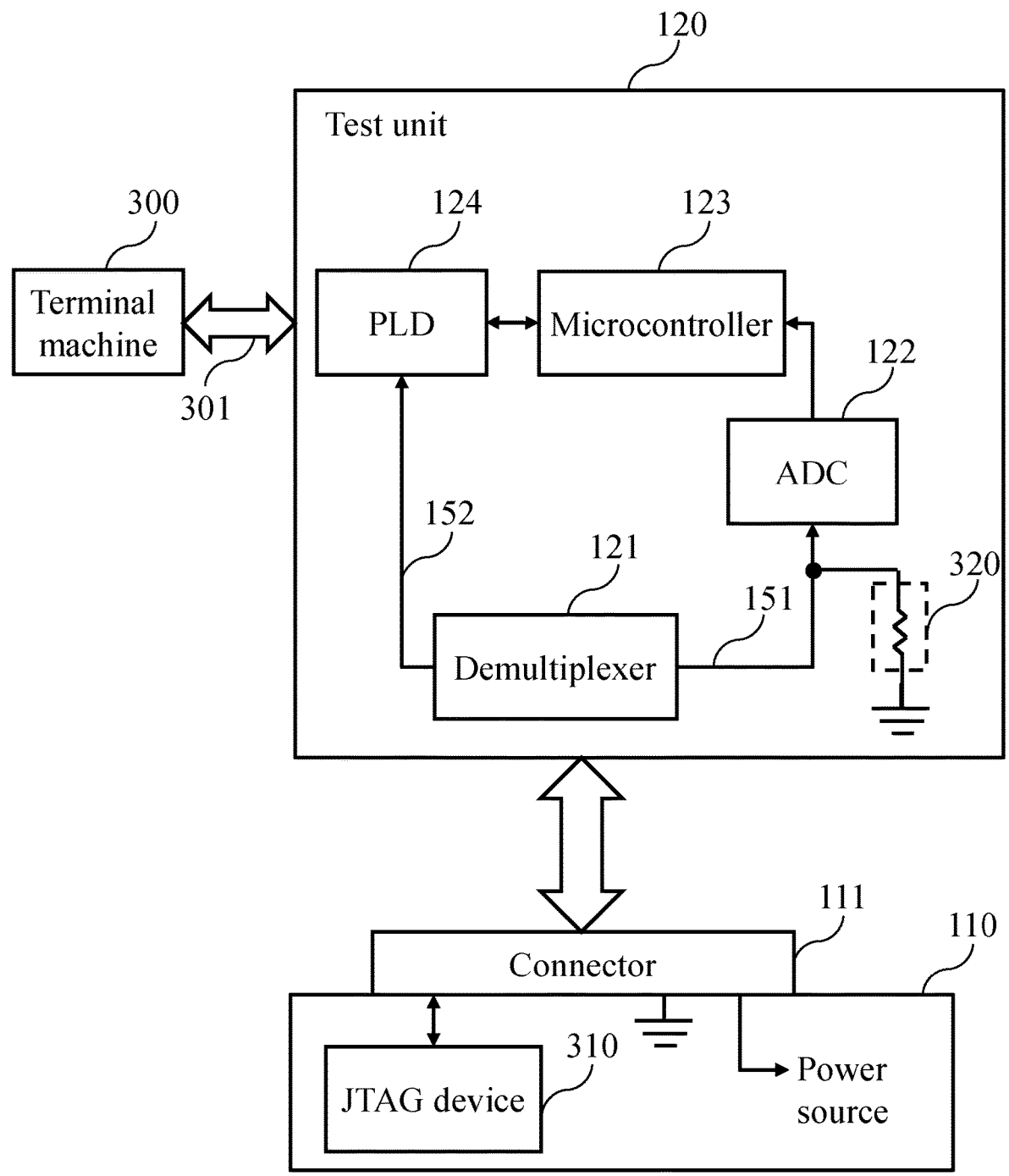
FIG. 3 is a schematic view of operation of using a JTAG instruction to control a PLD, according to an embodiment of the present invention.
Figure 4:
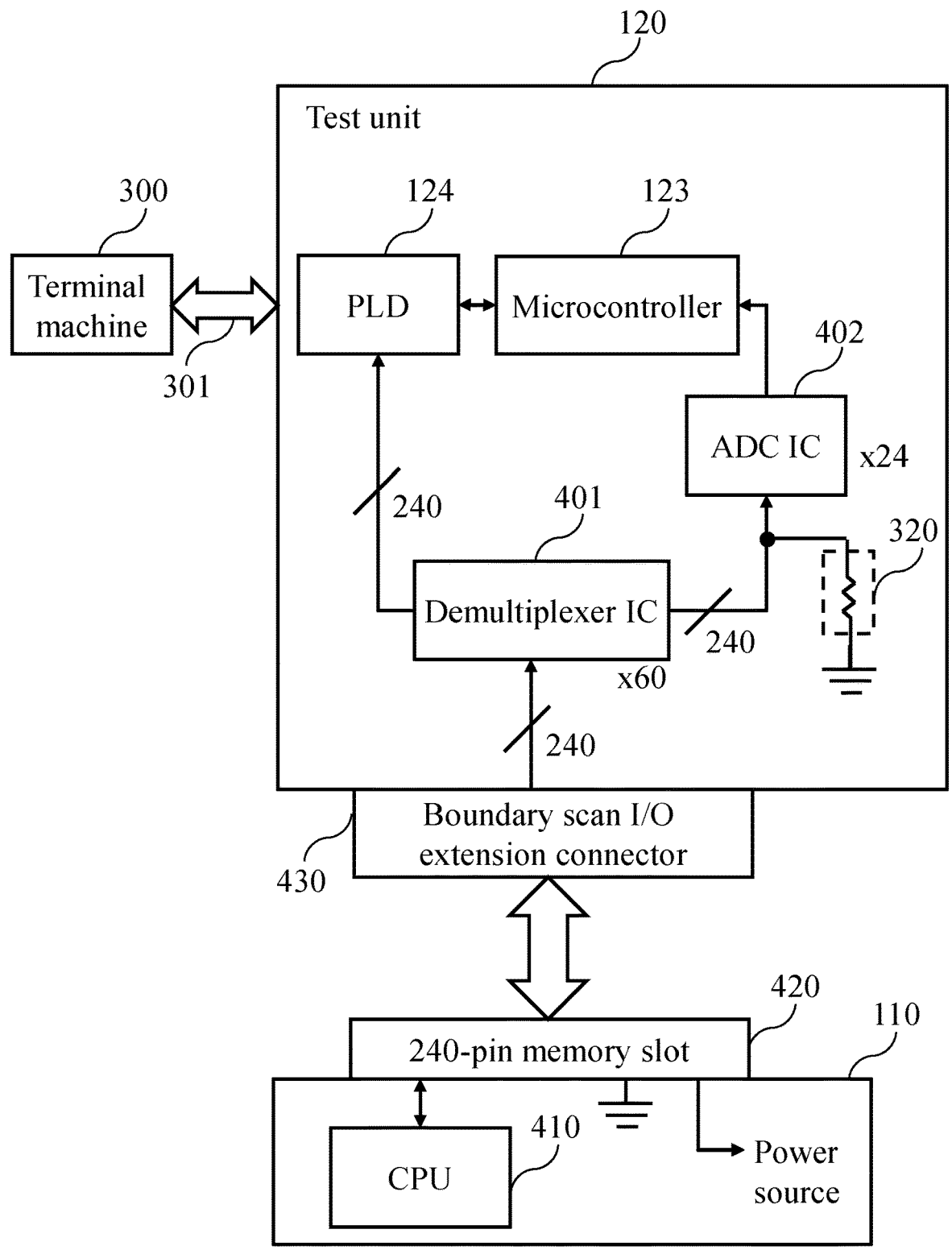
FIG. 4 is a schematic view of operation of testing a memory slot, according to an embodiment of the present invention.

The following illustrates the embodiment accompanied with FIGS. 3 and 4. Please refer to FIG. 3, which is a schematic view of operation of using the JTAG instruction to control the PLD, according to an embodiment of the present invention. In actual implementation, when the boundary scan interconnection test is performed, the JTAG instruction can be used to control the I/O pins of the PLD 124 to read) values on each of the plurality of pins, and compare the read values with the values outputted from the to-be-tested unit 110, and when the read value is equal to the values outputted from the to-be-tested unit 110, it indicates that no short circuit and open circuit occurs. The following illustrates flows of some embodiments in conditions that the to-be-tested signal is the power signal, the pull-up signal, the pull-down signal and the ground signal, respectively.

The first condition: the to-be-tested signal is the I/O interconnection signal

1. The demultiplexer 121 of the test unit 120 is electrically connected to the JTAG device 310 through the connector 111 to test connection statuses of the pins according to the to-be-tested signal generated by the JTAG device 310, and the to-be-tested signal is the I/O interconnection signal.

2. The terminal machine 300 uses the JTAG instruction to control the PLD 124, for example, the terminal machine 300 can transmit a "Extest" instruction (such as 11010101) according to the boundary scan description language (BSDL), so as to drive the PLD 124 to enter the boundary scan mode.

3. The terminal machine 300 uses the JTAG instruction to transmit data to a boundary scan register of the PLD 124. In an embodiment, all bits of preset data to be transmitted are 1, and it indicates all I/O pins are at an input mode. In actual implementation, the boundary scan register has cells corresponding to the I/O pins of the PLD 124, respectively. Each I/O pin can be set at the input mode or an output mode, or, an output value (such as 0 or 1) can be set to each I/O pin. Therefore, the boundary scan register of the PLD 124 can be used to set the working modes of the I/O pins of the PLD 124, and when the I/O pin is set at the input mode, the boundary scan register records value on the external I/O pin, such as 0 or 1.

4. The demultiplexer 121 is switched to the second line 152 which is electrically connected to the K pins of the I/O pins of the PLD 124, so that the to-be-tested signal from JTAG device 310 can be transmitted to the I/O pins of the PLD 124.

5. Through the JTAG interface 301, the terminal machine 300 can read the cells of the boundary scan register corresponding to the K pins, to read corresponding values, such as 0 or 1; and, the read values are then compared with the to-be-tested signal, and when the to-be-tested signal is equal to the read values, it indicates that test is passed; otherwise, it indicates an error occurs, and the connection message is generated according to the comparison result, for example, connection message records the to-be-tested signal and all read values.

The second condition: the to-be-tested signal is the power signal or the pull-up signal.

1. The demultiplexer 121 of the test unit 120 is electrically connected to power source (such as 3.3V power source) of the to-be-tested unit 110, and it indicates that the to-be-tested signal is the power signal; or, when the demultiplexer 121 of the test unit 120 is electrically connected to the pull-up signal, it indicates that the to-be-tested signal is the pull-up signal.

2. The terminal machine 300 uses the JTAG instruction to control the PLD 124, the terminal machine 300 can transmit the "Extest" instruction according to the BSDL, to drive the PLD 124 to enter the boundary scan mode.

3. The terminal machine 300 uses the JTAG instruction to transmit data to the boundary scan register of the PLD 124, to set the corresponding values to the pins of the PLD 124 electrically connected to the demultiplexer 121, that is, the K pins of the I/O pins of the PLD 124 are set as the corresponding values, so as to switch the demultiplexer 121 to the first line 151.

4. The eight I/O pins of the PLD 124 are used to generate the instruction code, and the instruction code is transmitted to the microcontroller 123; for example, in order to read the value of the 5th pin (AD pin) of the ADC 122, the values on the eight I/O pins can be set as 00000101, this instruction code indicates the request for reading the value of the 5th pin of the ADC 122.

5. The microcontroller 123 controls the ADC 122 by inter-integrated circuit ($I^2C$) protocol to read the digital voltage value from the ADC 122, and stores the digital voltage value, and the digital voltage value is then encoded as 8-bit code. The 8-bit code is then outputted to the eight I/O pins of the PLD 124; for example, an 8-bit code "00000000" indicates 0V, an 8-bit code "11111111" indicates 3.3V, an 8-bit code "10000000" indicates 1.67V, and so on.

6. The terminal machine 300 transmits the JTAG instruction through the JTAG interface 301, to read the value of the boundary scan register and obtain the 8-bit code transmitted from the microcontroller 123, so as to confirm whether the voltage of the power source is normal. When the voltage is 0V, it indicates that open-circuit occurs, and the first open-circuit message is generated, such as a text message describing "the power signal is at an open-circuit status" or "the pull-up signal is at an open-circuit status".

Third condition: the to-be-tested signal is the pull-down signal or the ground signal 1. The demultiplexer 121 of the test unit 120 is electrically connected to ground of the to-be-tested unit 110, and it indicates that the to-be-tested signal is the ground signal; and when the demultiplexer 121 of the test unit 120 is electrically connected to the pull-down signal, it indicates that the to-be-tested signal is the pull-down signal.

2. The terminal machine 300 uses the JTAG instruction to control the PLD 124, the terminal machine 300 can transmit the "Extest" instruction according to the BSDL, to drive the PLD 124 to enter the boundary scan mode.

3. The terminal machine 300 uses the JTAG instruction to transmit data to the boundary scan register of the PLD 124. In an embodiment, all bits of the preset data transmitted are 1, so that all I/O pins are set at the input mode.

4. The demultiplexer 121 is switched to the second line 152 which is electrically connected to the K pins of the I/O pins of the PLD 124, so that the to-be-tested signal can be transmitted to the I/O pins of the PLD 124.

5. The terminal machine 300 reads the potential statuses (such as 0 (Low) or 1 (High)) of the K pins from the boundary scan register through the JTAG interface 301. When the read potential status is not low (that is, 0 (Low)), the second open-circuit message is generated, for example, the second open-circuit message can be a text message describing "the ground signal is at an open-circuit status " or "the pull-down signal is at an open-circuit status".

It is to be noted that when the received to-be-tested signal is the pull-up signal and the read digital voltage value is not zero, the to-be-tested signal is transmitted to the second line 152 and not to the first line 151, the boundary scan interconnection test is then performed to read the status of the to-be-tested signal transmitted to the second line 152, so as to detect whether short-circuit occurs between the connection pins of the connector 111. When the received to-be-tested signal is the pull-down signal and the status of the read potential is not high, the boundary scan interconnection test is performed to read the status of the to-be-tested signal which is the pull-down signal, to detect whether short-circuit occurs between the connection pins of the connector 111.

In actual implementation, the first line 151 is electrically connected to one terminal of a pull-down resistor 320, the other terminal of the pull-down resistor 320 is grounded, and resistance of the pull-down resistor 320 is at least 1M ohm. In a condition that the power signal or the pull-up signal indicates occurrence of open-circuit, the pull-down resistor 320 can make the digital voltage value, converted from the ADC 122, be zero, so that the digital voltage value can be used to determine whether the power signal or the pull-up signal indicates occurrence of open-circuit. Preferably, the terminal machine 300 can be a computer device, such as a personal computer, a notebook computer, a wearable device, a smartphone and so on. The terminal machine 300 can transmit the JTAG instruction through the JTAG interface 301, to control the PLD 124 and read the I/O pins of the PLD 124. In an embodiment, the I/O pins of the PLD 124 can be general-purpose input/output (GPIO) pins. Furthermore, a user can operate the terminal machine 300 to perform circuit analysis to determine or the user can directly determine, whether the received to-be-tested signal is the I/O interconnection signal, the power signal, the pull-up signal, or the ground signal or the pull-down signal. Next, the JTAG instruction can be generated according to the determination result, and transmitted to the JTAG interface 301 to control the PLD 124 of the test unit 120, and read statuses of the I/O pins of the PLD 124.

Please refer to FIG. 4, which is a schematic view of operation of testing the memory slot, according to an embodiment of the present invention. In this embodiment, the connector is a 240-pin memory slot 420 electrically connected to the central processing unit (CPU) 410, the ground line and the power line. The connector comprises 240 pins and there are 240 to-be-tested signals, so the boundary scan I/O extension connector 430 of the test unit 120 also needs 240 pins to be electrically connected to the 240-pin memory slot 420 through a cable or an adapter. The boundary scan I/O extension connector 430 is electrically connected to a plurality of demultiplexers 121 through 240 conductive lines, respectively. For example, the demultiplexer(DEMUX) IC 401, which can be a device with model number 74CBTLV3257, can provide four demultiplexers 121, so that the 240 conductive lines can correspond to sixty DEMUX ICs 401 and served as the input terminals. Furthermore, there are 240 conductive lines, for transmitting the to-be-tested signal, formed between the 60 DEMUX ICs 401 and the PLD 124 and between the 60 DEMUX ICs 401 and the ADC IC 402, as shown in FIG. 4. These 480 conductive lines are served as the output terminals. In actual implementation, for example, the ADC IC 402, which can be a device with model number MAX1038, comprises ten ADCs 122, so that twenty-four ADC ICs 402 can perform analog-to-digital conversion on the voltage signal transmitted on all 240 conductive lines connected with the DEMUX IC 401. According to the type of the to-be-tested signal (for example, the to-be-tested signal can be the I/O interconnection signal, the power signal, the pull-up signal, the pull-down signal and the ground signal), the test process can be performed based on the flow shown in FIG. 3.

To summary, the difference between the technology of the present invention and the conventional technology is that the system and method of the present invention can use the JTAG instruction to control the PLD 124, to drive the demultiplexer 121 to transmit each to-be-tested signal, which is from the connector 111, to the first line 151 or the second line 152; and when the to-be-tested signal is transmitted to the first line 151, the to-be-tested signal is converted from analog to digital and encoded, and then transmitted to the I/O pins of the PLD 124 for reading; and, when the to-be-tested signal is transmitted to the second line 152, the PLD 124 can read the status of the I/O pins electrically connected to the second line 152; and then the PLD generates the test result according to the to-be-tested signals and the read the I/O pins. As a result, the above-mentioned technical solution can solve the conventional problems, so as to achieve the technical effect of improving convenience in testing the connection status of the pin of the connector.

The present disclosure disclosed herein has been described by means of specific embodiments. However, numerous modifications, variations and enhancements is made thereto by those skilled in the art without departing from the spirit and scope of the disclosure set forth in the claims.

What is claimed is:

1. A pin connection testing system for connector, applicable to a boundary scan test environment, and the pin connection testing system comprising:
   a to-be-tested unit comprising a connector, wherein the connector comprises a plurality of connection pins, and each of the plurality of connection pins corresponds to a to-be-tested signal; and
   a test unit electrically connected to the to-be-tested unit through the connector, and the test unit comprising:
      at least one demultiplexer electrically connected to the connector and configured to selectively transmit each to-be-tested signal to a first line or a second line;
      at least one analog to digital converter (ADC) comprising a set of analog input pins electrically connected to the first line and is configured to convert the to-be-tested signal which is transmitted to the first line into a digital voltage value;
      a microcontroller electrically connected to the at least one ADC, and configured to encode and convert the digital voltage value into N-bit data, wherein N is a positive integer; and
      a programmable logic device (PLD) comprising a set of I/O pins, wherein the PLD is electrically connected to the least one demultiplexer through K pins of the set of I/O pins to control the least one demultiplexer to select the first line or the second line, and the PLD is electrically connected to the second line through M pins of the set of I/O pins for reading a status of the to-be-tested signal which is transmitted to the second line, and the PLD is electrically connected to the microcontroller through N pins of the set of I/O pins for reading the N-bit digital voltage value;

wherein when one of the to-be-tested signals is an I/O interconnection signal, the PLD performs a boundary scan interconnection test to detect a status of the to-be-tested signal which is the I/O interconnection signal and generates a connection message;

wherein when one of the to-be-tested signals is a power signal or a pull-up signal, the PLD controls the at least one demultiplexer to select the first line, and the PLD reads the digital voltage value from the microcontroller, wherein when the read digital voltage value is zero, the PLD generates a first open-circuit message;

wherein when one of the to-be-tested signals is a ground signal or a pull-down signal, the PLD controls the at least one demultiplexer to select the second line, and the PLD performs a boundary scan to read a potential status corresponding to the to-be-tested signal which is the ground signal or the pull-down signal, wherein when the potential status is not low, the PLD generates a second open-circuit message;

wherein K and M are positive integers.

2. The pin connection testing system according to claim 1, wherein the first line is electrically connected to a terminal of a pull-down resistor, the other terminal of the pull-down resistor is grounded, and resistance of the pull-down resistor is at least 1M ohm.

3. The pin connection testing system according to claim 1, wherein when one of the to-be-tested signals is the pull-up signal and the read digital voltage value is not zero, the PLD switches selection of the demultiplexer from the first line to the second line, and performs the boundary scan interconnection test to read the status of the to-be-tested signal which is the pull-up signal through the M pins, so as to detect whether a short circuit occurs between the plurality of connection pins.

4. The pin connection testing system according to claim 1, wherein when one of the to-be-tested signals is the pull-down signal and the read potential status is not high, the PLD performs the boundary scan interconnection test to read the status of the to-be-tested signal which is the pull-down signal through the M pins, so as to detect whether a short circuit occurs between the plurality of connection pins.

5. The pin connection testing system according to claim 1, wherein the PLD and the to-be-tested unit comprises a joint test action group (JTAG) interface, respectively, configured to receive a JTAG instruction from a terminal machine, so that the terminal machine is able to control the set of I/O pins according to the JTAG instruction, and read statuses of the M pins.

6. A pin connection testing method for a connector, applicable to a boundary scan test environment, and the pin connection testing method comprising:

providing a to-be-tested unit comprising a connector, wherein the connector comprises a plurality of connection pins, and each of the plurality of connection pins corresponds to a to-be-tested signal;

providing a test unit, wherein the test unit is electrically connected to the to-be-tested unit through the connector and configured to receive the to-be-tested signals;

performing a boundary scan interconnection test, by the test unit, when one of the to-be-tested signals is an I/O interconnection signal, to detect a status of the to-be-tested signal which is the I/O interconnection signal and generating a connection message;

transmitting, by the test unit, when one of the to-be-tested signals is a power signal or a pull-up signal, the to-be-tested signal which is the power signal or the pull-up signal to a first line, and converting the to-be-tested signal which is the power signal or the pull-up signal into a digital voltage value, wherein when the read digital voltage value is zero, the test unit generates a first open-circuit message; and transmitting, by the test unit, when one of the to-be-tested signals is a ground signal or a pull-down signal, the to-be-tested signal which is the ground signal or the pull-down signal to a second line, and performing a boundary scan to read a potential status corresponding to the to-be-tested signal which is the ground signal or the pull-down signal, wherein when the potential status is not low, the test unit generates a second open-circuit message.

7. The pin connection testing method according to claim 6, wherein when one of the to-be-tested signals is the pull-up signal and the read digital voltage value is not zero, the test unit transmits the to-be-tested signal to the second line and not to the first line, and the test unit performs the boundary scan interconnection test to read the status of the to-be-tested signal which is the pull-up signal, so as to detect whether a short circuit occurs between the plurality of connection pins.

8. The pin connection testing method according to claim 6, wherein when one of the to-be-tested signals is the pull-down signal and the read potential status is not high, the test unit performs the boundary scan interconnection test to read the status of the to-be-tested signal which is the pull-down signal, so as to detect whether a short circuit occurs between the plurality of connection pins.

9. The pin connection testing method according to claim 6, wherein the to-be-tested unit and the test unit comprises a JTAG interface, respectively, configured to receive a JTAG instruction from a terminal machine, so that the terminal machine is able to control the test unit according to the JTAG instruction, to read the status of the to-be-tested signal which is transmitted to the second line.

10. The pin connection testing method according to claim 9, wherein the terminal machine performs circuit analysis to determine whether one of the to-be-tested signals is the PO interconnection signal, the power signal, the pull-up signal, the ground signal or the pull-down signal, and the terminal machine generates the JTAG instruction according to a determination result, and transmits the generated JTAG instruction to the JTAG interface of the test unit for controlling the test unit.

* * * * *